(12) United States Patent
Kim

(10) Patent No.: US 7,883,981 B2
(45) Date of Patent: Feb. 8, 2011

(54) METHOD FOR MANUFACTURING FLASH MEMORY DEVICE

(75) Inventor: Dong-Oog Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/337,613

(22) Filed: Dec. 17, 2008

(65) Prior Publication Data

US 2009/0159953 A1    Jun. 25, 2009

(30) Foreign Application Priority Data

Dec. 24, 2007    (KR) ...................... 10-2007-0136550

(51) Int. Cl.
H01L 21/336    (2006.01)

(52) U.S. Cl. ............... 438/303; 438/257; 257/E21.626; 257/E21.64; 257/E21.302

(58) Field of Classification Search ........... 257/E21.205
See application file for complete search history.

(56) References Cited

U.S. PATENT DOCUMENTS 6,136,636 A * 10/2000 Wu ............................ 438/231
6,323,519 B1 * 11/2001 Gardner et al. .............. 257/336
2002/0045360 A1 * 4/2002 Murakami et al. ........... 438/786
2004/0115894 A1 * 6/2004 Park et al. ................... 438/366
2005/0170606 A1 * 8/2005 Fu et al. ..................... 438/424
2005/0260808 A1 * 11/2005 Chen et al. .................. 438/197

FOREIGN PATENT DOCUMENTS

KR    10-2006-0075365    7/2006
KR    10-2006-0100092    9/2006

* cited by examiner

*Primary Examiner*—Julio J Maldonado
*Assistant Examiner*—Shaka Scarlett
(74) *Attorney, Agent, or Firm*—Sherr & Vaughn, PLLC

(57) ABSTRACT

Embodiments relate to a flash memory device and a method for manufacturing a flash memory device. According to embodiments, a method may include forming a gate on and/or over a semiconductor substrate on and/or over which a device isolation film may be formed, forming a first spacer including a first oxide pattern and a first nitride pattern on and/or over side walls of the gate, forming a source and drain area on and/or over the semiconductor substrate using the gate and spacer as masks, removing the first nitride pattern of the first spacer, and forming a second spacer including a second oxide film pattern and a second nitride film pattern on and/or over the side walls of the gate by performing an annealing process on and/or over the semiconductor substrate on and/or over which the first oxide film pattern is formed.

9 Claims, 8 Drawing Sheets

METHOD FOR MANUFACTURING FLASH MEMORY DEVICE

The present application claims priority under 35 U.S.C. 119 to Korean Patent Application No. 10-2007-0136550 (filed on Dec. 24, 2007), which is hereby incorporated by reference in its entirety.

BACKGROUND

A flash memory may be a nonvolatile memory medium of which stored data may not be damaged even when a power supply may be turned off. A flash memory may have an advantage that the speed of data processing, such as recording, reading, and deleting, etc., may be relatively high.

A flash memory may be used for a Basic Input Output System (BIOS) of a PC, and for storing data of a set-top box, a printer, a network server, etc. A flash memory may also be used for small personal electronic devices, such as digital cameras, cellular phones, and the like.

SUMMARY

Embodiments relate to a flash memory device and a method for manufacturing a flash memory device.

According to embodiments, a method for manufacturing a flash memory device may include at least one of the following. Forming a gate on and/or over a semiconductor substrate, on and/or over which a device isolation film may be formed. Forming a first spacer including a first oxide pattern and a first nitride pattern on and/or over side walls of the gate. Forming a source and drain area on and/or over the semiconductor substrate using the gate and spacer as masks. Removing the first nitride pattern of the first spacer. Forming a second spacer including a second oxide film pattern and a second nitride film pattern on and/or over the side walls of the gate by performing an annealing process to the semiconductor substrate on and/or over which the first oxide film pattern is formed.

DRAWINGS

Example FIGS. 1 through 16 are cross-sectional views illustrating a flash memory device and processes for manufacturing a flash memory device, according to embodiments.

DESCRIPTION

Example FIGS. 1 through 16 are cross-sectional views illustrating a flash memory device and processes for manufacturing a flash memory device according to embodiments. Example FIGS. 1 through 16 may illustrate cell area A and peripheral area B.

Figure 1:
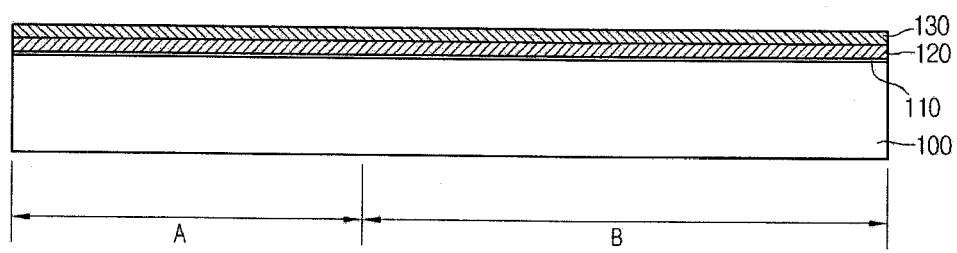

Referring to example FIG. 1, first oxide film 110, first nitride film 120, and second oxide film 130 may be formed on and/or over semiconductor substrate 100. According to embodiments, first nitride film 120 may include SiN. According to embodiments, second oxide film 130 may include tetraethly orthosilicate (TEOS).

Figure 2:
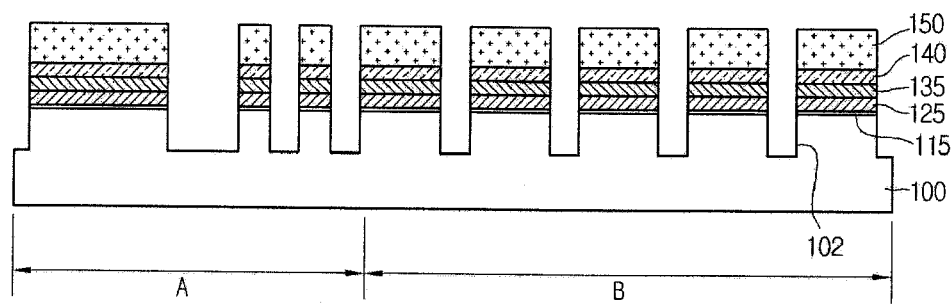

Referring to example FIG. 2, first photoresist pattern 150 may be formed on and/or over semiconductor substrate 100, and a first etch process may be performed. This may form trench 102, first oxide film pattern 115, first nitride film pattern 125, and second oxide film pattern 135.

According to embodiments, a first etch processing may be performed after forming anti -reflection film pattern 140 below first photoresist pattern 150. According to embodiments, anti-reflection film pattern 140 may be formed between second oxide film pattern 135 and first photoresist pattern 150.

Figure 3:
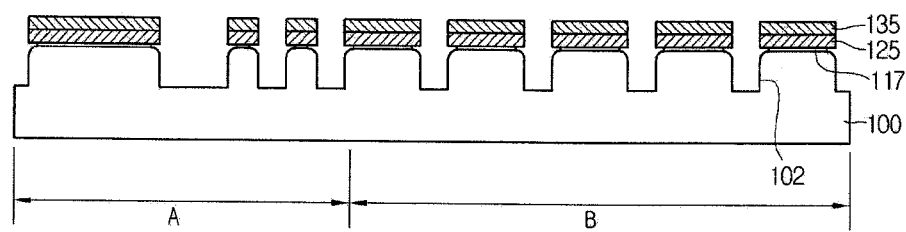

Referring to example FIG. 3, according to embodiments, after anti-reflection film pattern 140 and first photoresist pattern 150 may be removed, a portion of first oxide film pattern 115 that may be formed on and/or over semiconductor substrate 100 may be removed. This may form third oxide film pattern 117 and may allow edges of trench 102 to be substantially rounded. According to embodiments, third oxide film pattern 117 may be formed by removing edge areas of first oxide film pattern 115 by about 100 Å through a third etch process. According to embodiments, the third etch process may be performed using a wet etch process.

According to embodiments, a second etch process may be performed on and/or over trench 102. This may allow edges of trench 102 to be substantially rounded. According to embodiments, the second etch process may be performed using a chemical dry etch process.

According to embodiments, as edges of trench 102 may be rounded, defects of a device that may be caused by energy focused on the edges may be prevented.

Figure 4:
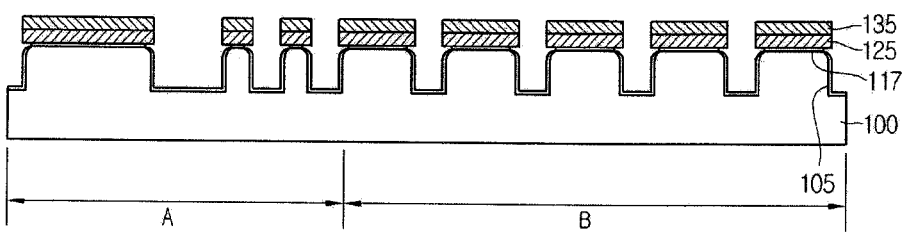

Referring to example FIG. 4, a first annealing process may be performed on and/or over semiconductor substrate 100. This may form fourth oxide film pattern 105 in trench 102. According to embodiments, fourth oxide film pattern 105 may be formed inside trench 102 and may release stress of material that may subsequently be buried in the trench. According to embodiments, fourth oxide film pattern 105 may prevent a diffusion of doping elements in a well that may be subsequently formed. According to embodiments, fourth oxide film pattern 105 may be formed by performing a first thermal oxidation process on and/or over semiconductor substrate 100.

Figure 5:
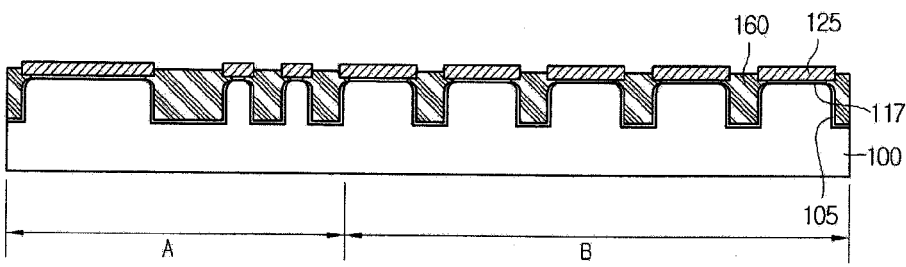

Referring to example FIG. 5, insulating material 160 may be formed, and may bury trench 102. According to embodiments, an insulating film may be formed on and/or over semiconductor substrate 100 on and/or over which trench 102 may be formed. A planarization process may be performed and may form insulating material 160. According to embodiments, second oxide film pattern 135 may then be removed. According to embodiments, insulating material 160 may include high density plasma-undoped silicate glass (HDP-USG).

Second oxide film pattern 135 may be removed through a wet cleaning process, and a portion of the insulating material buried in trench 102 may also be removed through a wet cleaning process.

When insulating material 160 may be formed on and/or over trench 102, a device isolation film that may insulate various devices that may be formed on and/or over semiconductor substrate 100 may also be formed.

Figure 6:
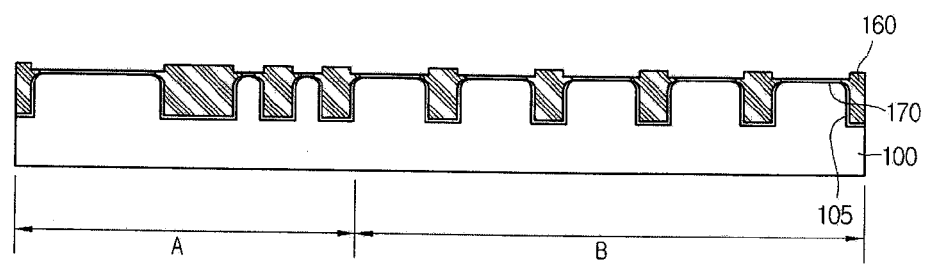

Referring to example FIG. 6, according to embodiments, first nitride film pattern 125 may be removed. Fifth oxide film pattern 170 may be formed on and/or over semiconductor substrate 100. Fifth oxide film pattern 170 may be formed by performing a second annealing process. This may prevent devices from being damaged by an ion implantation when later forming a well.

Figure 7:
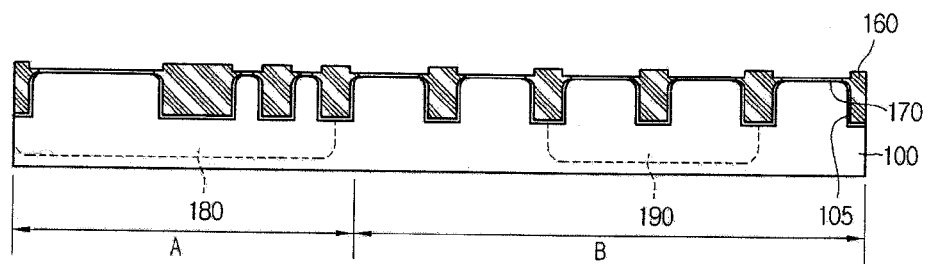

Referring to example FIG. 7, first impurity area 180 and second impurity area 190 may be formed on and/or over semiconductor substrate 100 on and/or over which fifth oxide film pattern 170 may be formed. According to embodiments, first impurity area 180 and second impurity area 190 may be formed by performing a first ion implantation process and a second ion implantation process. According to embodiments, first impurity area 180 and second impurity area 190 may be formed having a triple well structure.

The first ion implantation process may be completed by forming a second photoresist pattern on and/or over areas other than an area where first impurity area 180 may be formed and then implanting an impurity thereto. The second ion implantation process may be completed by forming a third photoresist pattern on and/or over areas other than an area where second impurity area 190 may be formed and then implanting an impurity thereto. According to embodiments, first impurity area 180 and second impurity area 190 may be a p-well or an n-well.

Figure 8:
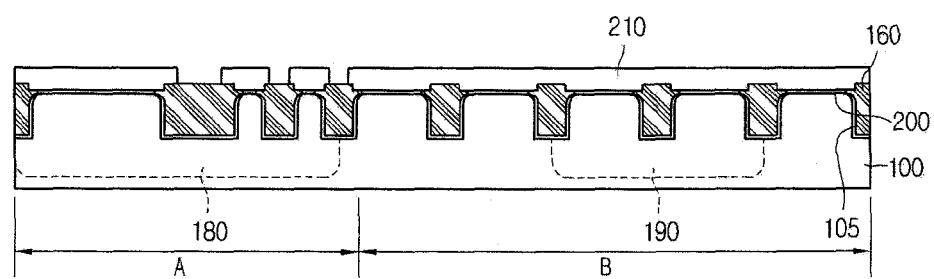

Referring to example FIG. 8, fifth oxide film pattern 170 may be removed and sixth oxide film pattern 200 may be formed on and/or over semiconductor substrate 100. According to embodiments, poly silicon pattern 210 may be formed on and/or over sixth oxide film pattern 200. Fifth oxide film pattern 170 may be removed through a wet cleaning process. According to embodiments, first poly silicon pattern 210 may be formed by forming and patterning a first poly silicon film on and/or over semiconductor substrate 100.

Figure 9:
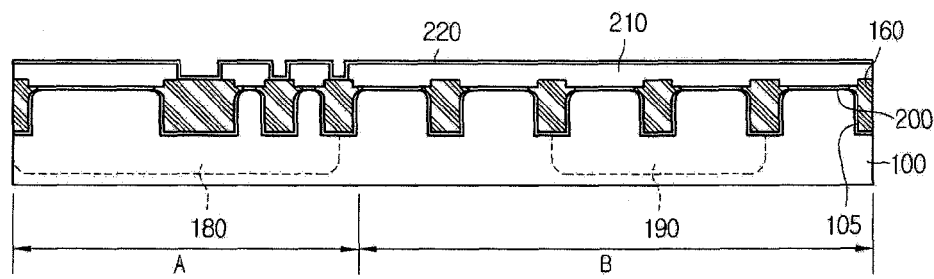

Referring to example FIG. 9, dielectric film 220 may be formed on and/or over first poly silicon pattern 210. According to embodiments, dielectric film 220 may include a oxide-nitride -oxide (ONO) film stacked with a third oxide film, a second nitride film, and a fourth oxide film.

Figure 10:
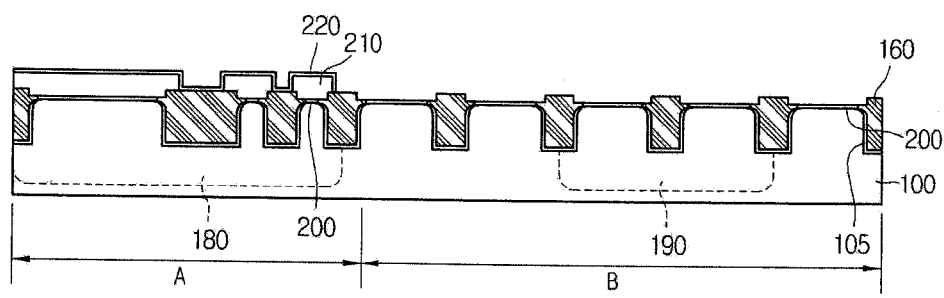

Referring to example FIG. 10, first poly silicon pattern 210 and dielectric film 220 on and/or over peripheral area B of semiconductor substrate 100 may be removed. According to embodiments, first poly silicon pattern 210 and dielectric film 22 may remain only on and/or over cell area A.

Figure 11:
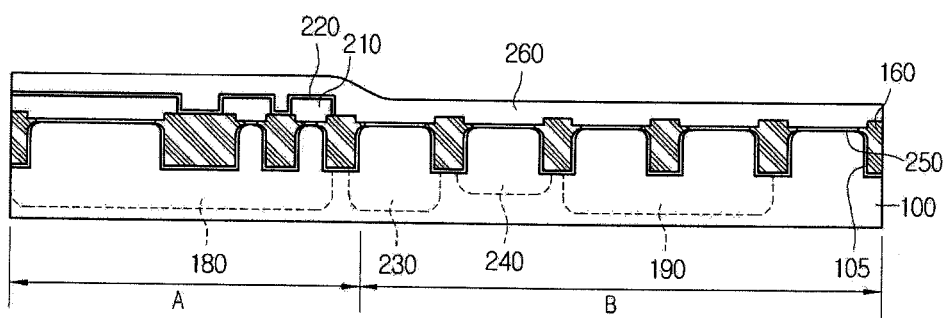

Referring to example FIG. 11, third impurity area 230 and fourth impurity area 240 may be formed on and/or over semiconductor substrate 100 in peripheral area B, and seventh oxide film pattern 250 and second poly silicon film 260 may be formed on and/or over semiconductor substrate 100.

According to embodiments, third impurity area 230 and fourth impurity area 240 may be formed by performing a third ion implantation process and a fourth ion implantation process. According to embodiments, third impurity area 230 and fourth impurity area 240 may be formed having a triple well structure.

According to embodiments, a third ion implantation process may be completed by forming a fourth photoresist pattern on and/or over areas other than an area where third impurity area 230 may be formed and then implanting an impurity thereto. According to embodiments, a fourth ion implantation process may be completed by forming a fifth photoresist pattern on and/or over areas other than an area where fourth impurity area 240 may be formed and then implanting an impurity thereto. According to embodiments, third impurity area 230 and fourth impurity area 240 may be a p-well or an n-well. Seventh oxide film pattern 250 may be formed by performing a thermal oxidation process.

Figure 12:
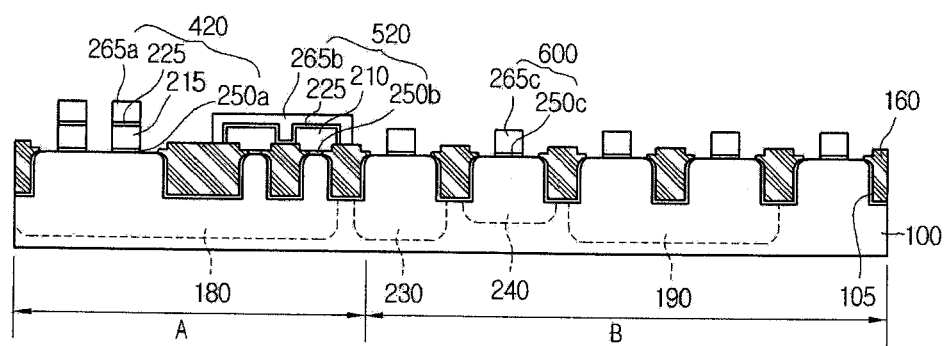

Referring to example FIG. 12, second poly silicon film 260 may be patterned and may form second silicon pattern 265, which may form first gate 420, second gate 520, and third gate 600. According to embodiments, first gate 420 may be a floating gate, and second gate 520 and third gate 600 may be control gates.

According to embodiments, first gate 420 may be formed by stacking eighth oxide film pattern 250a, second poly silicon pattern 215, first dielectric film pattern 225, and third poly silicon pattern 265a. First gate 420 may operate as a bit line on and/or over cell area A.

According to embodiments, second gate 520 may be formed by stacking ninth oxide film pattern 250b, second dielectric film pattern 225, and fourth poly silicon pattern 265b. Second gate 520 may operate as a word line on and/or over cell area A.

Third gate 600 may be formed by stacking tenth oxide film pattern 250c and fifth poly silicon pattern 265.

Figure 13:
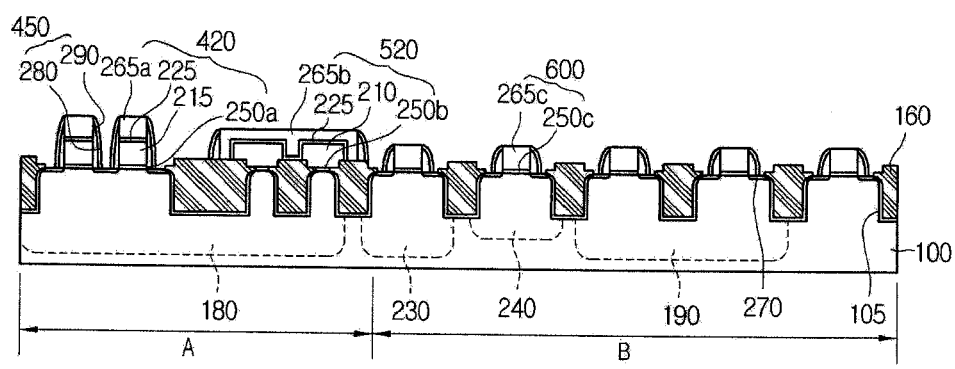

Referring to example FIG. 13, lightly doped drain (LDD) area 270 may be formed on and/or over semiconductor substrate 100. First spacers 450 may then be formed on and/or over side walls of first gate 420, second gate 520, and third gate 600. According to embodiments, LDD areas 270 may be formed by ion implanting using first gate 420, second gate 520, and third gate 600 as masks.

According to embodiments, fifth oxide film and a second nitride film may be formed on and/or over semiconductor substrate 100 on and/or over which first gate 420, second gate 520, and third gate 60, and an etch process may be performed. This may make it possible to form spacers 450, which may include eleventh oxide film pattern 280 and second nitride film pattern 290. According to embodiments, an etch process may be performed using an anisotropic etching.

Figure 14:
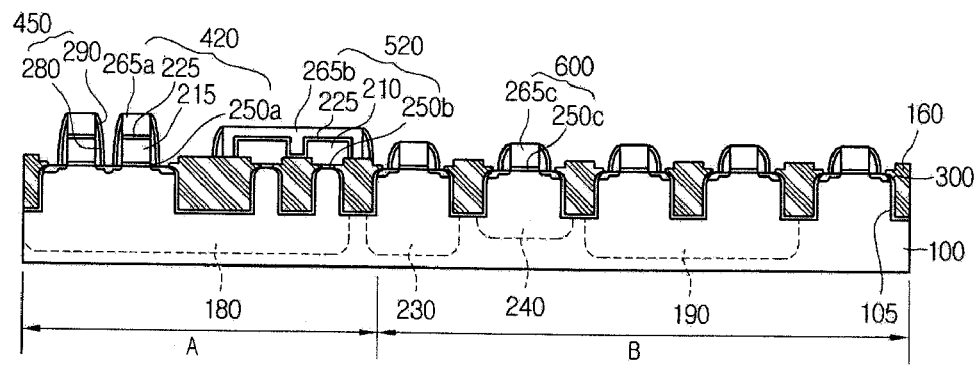

Referring to example FIG. 14, an ion implantation process may be performed using first gate 420, second gate 520, third gate 600, and first spacer 450. This may form source/drain area 300 on and/or over semiconductor substrate 100.

Figure 15:
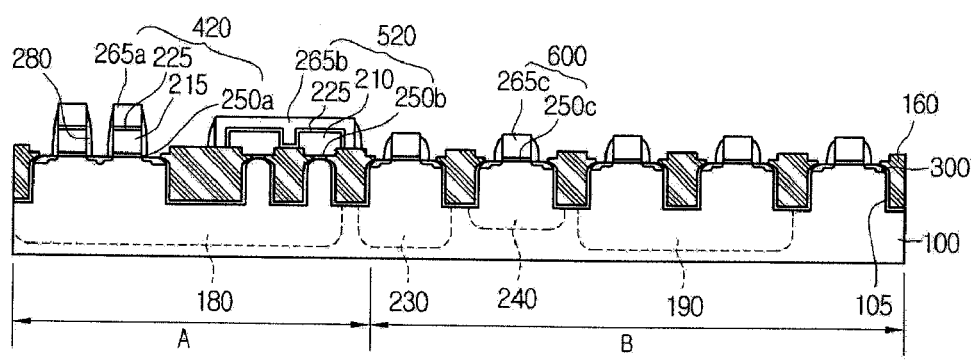

Referring to example FIG. 15, second nitride film pattern 290 of first spacer 450 may be removed. According to embodiments, only eleventh oxide film pattern 280 may remain on and/or over side walls of first gate 420, second gate 520, and third gate 600.

According to embodiments, second nitride film pattern 290 may be removed through a wet etch process.

Figure 16:
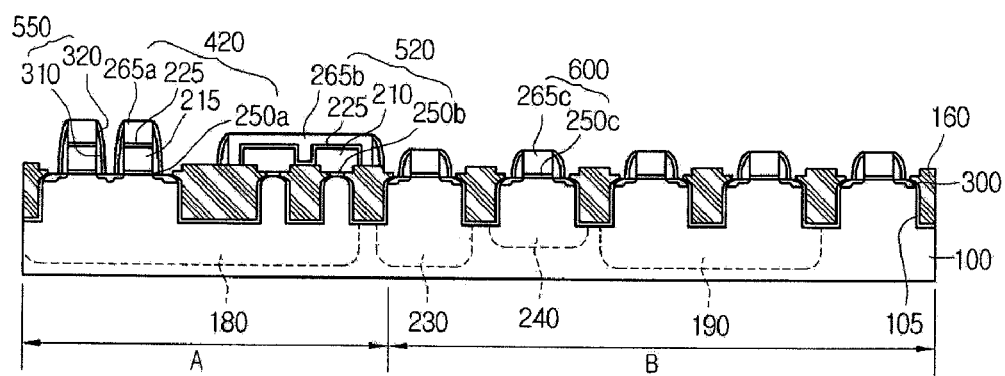

Referring to example FIG. 16, second spacers 550, which may include eleventh oxide film pattern 310 and fourth nitride film pattern 320, may be formed on and/or over side walls of first gate 420, second gate 520, and third gate 600.

According to embodiments, second spacers 550 may be formed during an annealing process, which may be performed to activate source/drain area 300. According to embodiments, the annealing process may be performed under an $N_2$ atmosphere.

According to embodiments, during an annealing process, $N_2$ gas may be implanted into eleventh oxide film pattern 280 and a portion of eleventh oxide film pattern 280 may be nitrified. This may form second spacers 550, which may include twelfth oxide film pattern 310 and third nitride film patter 320 on and/or over side walls of first gate 420, second gate 520, and third gate 600.

According to embodiments, second spacers 550 may be formed simultaneously with activating source/drain area 300 through an annealing process.

According to embodiments, a salicide process may be performed on and/or over semiconductor substrate 100. This may make it possible to form a silicide layer on and/or over the gate and source/drain areas, and may form an insulating film. According to embodiments, a contact may be formed on and/or over the insulating film and semiconductor substrate 100.

According to embodiments, a method for manufacturing a flash memory device may form an oxide film on and/or over a side wall of a gate and may perform an annealing process using $N_2$ gas to nitrify a portion of the oxide film and form a thin spacer on and/or over the side wall of the gate. This may make it possible to improve an integration of a memory device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:
   forming a gate over a semiconductor substrate;
   forming a first spacer including a first oxide film pattern and a first nitride film pattern over side walls of the gate;
   forming a source and drain area over the semiconductor substrate using the gate and first spacer as masks;
   removing the first nitride pattern of the first spacer before activating the source and drain area; and
   forming a second spacer including a second nitride film pattern over the side walls of the gate by performing an annealing process on the semiconductor substrate over which the first oxide film pattern is formed,
   wherein the forming of the second nitride film pattern is performed simultaneously with activating the source and drain area through the annealing process.

2. The method of claim 1, wherein forming the first spacer comprises:
   forming a first oxide film over the semiconductor substrate including the gate;
   forming a first nitride film over the first oxide film; and
   forming the first oxide film pattern and the second nitride film pattern over side walls of the gate by performing an anisotropic etching over the first nitride film and first oxide film.

3. The method of claim 1, wherein the first nitride film pattern comprises silicon nitride (SiN) and the first oxide film pattern comprises tetraethly orthosilicate (TEOS).

4. The method of claim 1, wherein the gate is formed by stacking a second oxide film pattern and a first poly silicon pattern.

5. The method of claim 1, wherein the gate is formed by stacking a third oxide film pattern, a second poly silicon pattern, a dielectric film and a third poly silicon pattern.

6. The method of claim 1, wherein the annealing process is performed under an nitrogen gas ($N_2$) atmosphere.

7. The method of claim 6, wherein the nitrogen gas ($N_2$) is implanted into the first oxide film pattern through the annealing process so that a portion of the first oxide film pattern is nitrified.

8. The method of claim 1, wherein the first nitride film pattern is removed through a wet etch process.

9. The method of claim 1, comprising forming a trench in the semiconductor substrate having edges that are substantially rounded.

* * * * *